United States Patent [19]
Hsuan et al.

[11] Patent Number: 6,031,293
[45] Date of Patent: Feb. 29, 2000

[54] PACKAGE-FREE BONDING PAD STRUCTURE

[75] Inventors: Min-Chih Hsuan; Fu-Tai Liou, both of Hsinchu, Taiwan

[73] Assignee: United Microelectronics Corporation, Hsinchu, Taiwan

[21] Appl. No.: 09/299,330

[22] Filed: Apr. 26, 1999

[51] Int. Cl.[7] .................................................. H01K 23/48
[52] U.S. Cl. ........................ 257/786; 257/698; 257/700; 257/774; 257/780; 257/781; 257/786
[58] Field of Search ..................................... 257/698, 700, 257/774, 780, 786, 781, 737, 734, 777

[56] References Cited

U.S. PATENT DOCUMENTS

| | | | |
|---|---|---|---|
| 5,289,038 | 2/1994 | Amano | 257/780 |
| 5,726,498 | 3/1998 | Licatta et al. | 257/773 |
| 5,814,891 | 9/1998 | Hirano | 257/778 |
| 5,962,918 | 10/1999 | Kimura | 257/738 |

FOREIGN PATENT DOCUMENTS

| | | | |
|---|---|---|---|
| 402036534 | 2/1990 | Japan | 257/775 |
| 4021170554 | 7/1990 | Japan | 257/775 |

OTHER PUBLICATIONS

IBM Technical Disclosure "Flip Chip Assembly for Improved Thermal Performance", vol. 37 No. 07, Jul. 1994.

IBM Technical Disclosure "Flip Chip Terminal for Semiconductor Devices" vol. 21 No. 3, Aug. 1978.

Primary Examiner—Mahshid Saadat
Assistant Examiner—Edgardo Ortiz
Attorney, Agent, or Firm—Hickman Stephens Coleman & Hughes, LLP

[57] ABSTRACT

A package-free bonding pad structure on a silicon chip that includes a plurality of metal pads on the upper surface of the silicon chip and a passivation layer covering the upper surface of the silicon chip. The passivation layer has a plurality of open cavities directly above the metal pad areas for exposing a portion of each metal pad. Diameter of the open cavity gets smaller on approaching the upper surface of the passivation layer and grows bigger in the neighborhood of the metal pad area.

19 Claims, 5 Drawing Sheets

PACKAGE-FREE BONDING PAD STRUCTURE

BACKGROUND OF THE INVENTION

1. Field of Invention

The present invention relates to a bonding pad structure on a semiconductor chip. More particularly, the present invention relates to a package-free bonding pad structure.

2. Description of Related Art

After years of development, semiconductor devices are now used almost everywhere. However, integrated circuit (IC) chips fabricated in a semiconductor manufacturing plant are practically useless unless they are properly packaged. The IC chip must first be mounted on a suitable carrier, and then the carrier itself must be enclosed by a protective casing before the IC chip can be inserted inside electrical equipment. In general, the packaging process can be roughly divided into three stages:

1. A proper carrier must be selected for holding the silicon chip. Different types of carriers are available including lead frames, film carriers and printed circuit boards (PCB). Normally, the use of a film carrier requires tape automatic bonding (TAB).
2. The silicon chip must be electrically connected to the carrier. At present, the techniques for connecting a silicon chip to a carrier includes wire bonding, tape automatic bonding and flip chip or controlled collapse chip connection.
3. The silicon chip and the carrier including their junction areas must be enclosed by epoxy resin, ceramics or other packaging material, thereby forming a rigid body for protecting the IC chip and its connecting elements.

However, before the contact points on an IC chip can be used to couple electrically with the carrier, a special structure for electrical connection such as a bonding pad or a bump must first be created at those contact points. Moreover, the establishment of a proper electrical connection between the bonding pads or bumps on the silicon chip with the carrier must be carried out in special processing stations. FIG. 1 is a schematic cross-sectional side view showing conventional wire connection between a bonding pad on a silicon chip and a lead frame pin using wire-bonding techniques. First, a metallic bonding pad 12 is formed on a silicon chip 10. Thereafter, the silicon chip and its surrounding lead frame are placed inside a specified wire-bonding machine. Next, the wire-bonding machine operates to bond one end of a short piece of conductive wire 14 to the bonding pad 12, and then followed by bonding the other end of the wire 14 to the lead frame pin 16. In general, the conductive wires 14 can be gold, aluminum or copper wires.

FIG. 2 is a schematic cross-sectional side view showing conventional electrical connection between a bonding pad on a silicon chip and tape carrier using tape automatic bonding techniques. The method includes forming a bump 20 either on top of a bonding pad 12 or on the inner lead 18 of a film carrier. Next, an inner lead bonding (ILB) operation is carried out to join the bonding pad 12 and a portion of the inner lead 18 together. Thereafter, an outer lead bonding (OLB) operation is carried out to join the outer lead with the electrode on a substrate plate using soldering, anisotropic conductive film (ACF) or photoharden insulation resin.

FIG. 3 is a schematic cross-sectional side view showing conventional electrical connection between a bonding pad on a silicon chip and a package medium using flip-chip techniques. Similarly, the flip-chip method involves the formation of a bump 22 on a bonding pad 12. A special machine must be used for aligning the bump 22 with the electrode 26 on a base substrate 26 and exerting a proper amount of pressure on the silicon chip. Finally, heating and underfilling operations have to be carried out by the machine.

However, in all three illustrations above, special processing operations using special processing stations have to be carried out just to link up with the bonding pads. Hence, additional processing time and production cost is incurred.

SUMMARY OF THE INVENTION

The present invention is to provide a package-free bonding pad structure capable of directly coupling to a carrier or a base substrate without having to go through a third conductive medium.

The invention provides a package-free bonding pad structure having an internally bulging female socket cavity that can interlock with a similarly shaped externally bulging male plug on a carrier or a base substrate.

To achieve these and other advantages and in accordance with the purpose of the invention, as embodied and broadly described herein, the invention provides a package-free bonding pad structure that can be used on a silicon chip. The bonding pad structure includes a plurality of metal pads on the upper surface of the silicon chip and a passivation layer having a plurality of openings. The open cavities are formed over the metal pads for exposing a portion of the metal pad area. The diameter of the each open cavity gets smaller on approaching the upper surface of the passivation layer and gets bigger on approaching the metal pad. Consequently, a bulging internal cavity is formed. In addition, the metal pads do not necessarily have to be constructed out of the uppermost metallic layer. In practice, the metal pads can be patterned out of any one of a multiple of multilevel interconnect layers so that the remaining insulating layers above can serve as one thick passivation layer.

According to one preferred embodiment of this invention, the metal pads atop the silicon chip can be arranged to form an area array configuration. Alternatively, the metal pads can be arranged to lie on the peripheral region of the silicon chip. Furthermore, the passivation layer can surround the metal pads on all four sides or the passivation layer can surround the metal pads on three sides exposing the side that borders on the edge of the silicon chip. In addition, bonding pads having a structure according to this invention can be built around conventional bonding pads. After each conventional bonding pad is connected electrically with its neighboring bonding pads, external connection to the conventional bonding pads can be made similarly by snapping male plugs onto the bonding pad structure of this invention.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
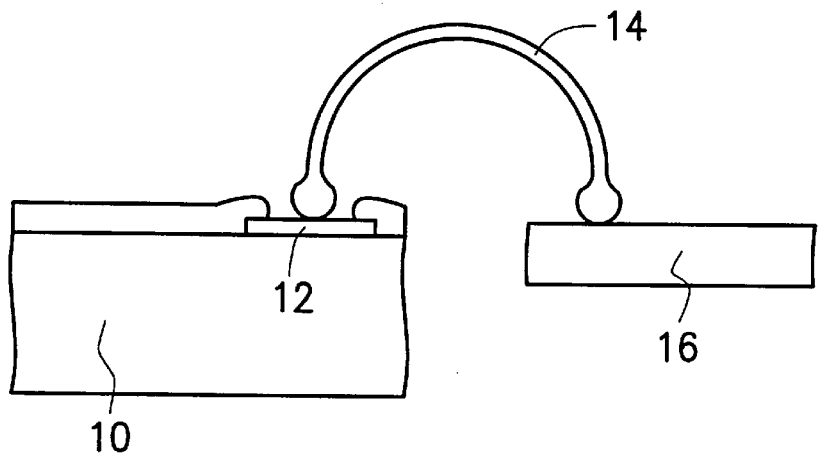
FIG. 1 is a schematic cross-sectional side view showing conventional wire connection between a bonding pad on a silicon chip and a lead frame pin using wire-bonding techniques.
Figure 2:
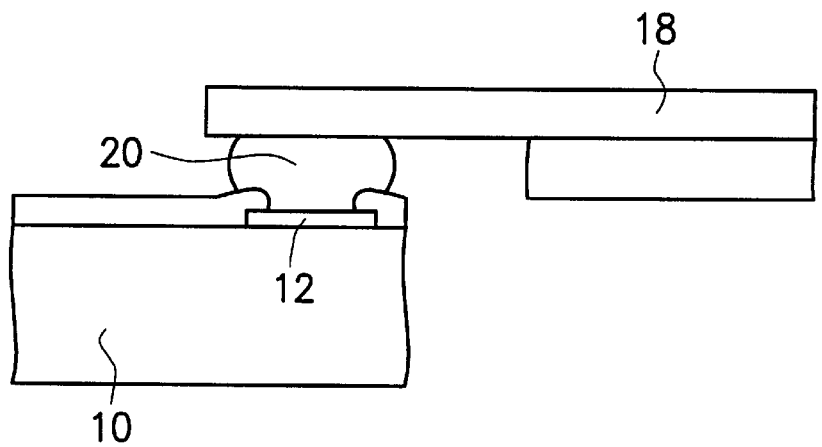
FIG. 2 is a schematic cross-sectional side view showing conventional electrical connection between a bonding pad on a silicon chip and tape carrier using tape automatic bonding techniques.
Figure 3:
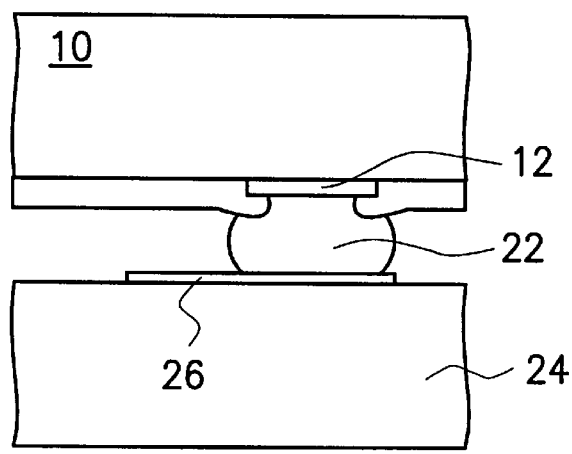
FIG. 3 is a schematic cross-sectional side view showing conventional electrical connection between a bonding pad on a silicon chip and a package medium using flip-chip techniques.

Reference will now be made in detail to the present preferred embodiments of the invention, examples of which are illustrated in the accompanying drawings. Wherever possible, the same reference numbers are used in the drawings and the description to refer to the same or like parts.

Figure 4A:
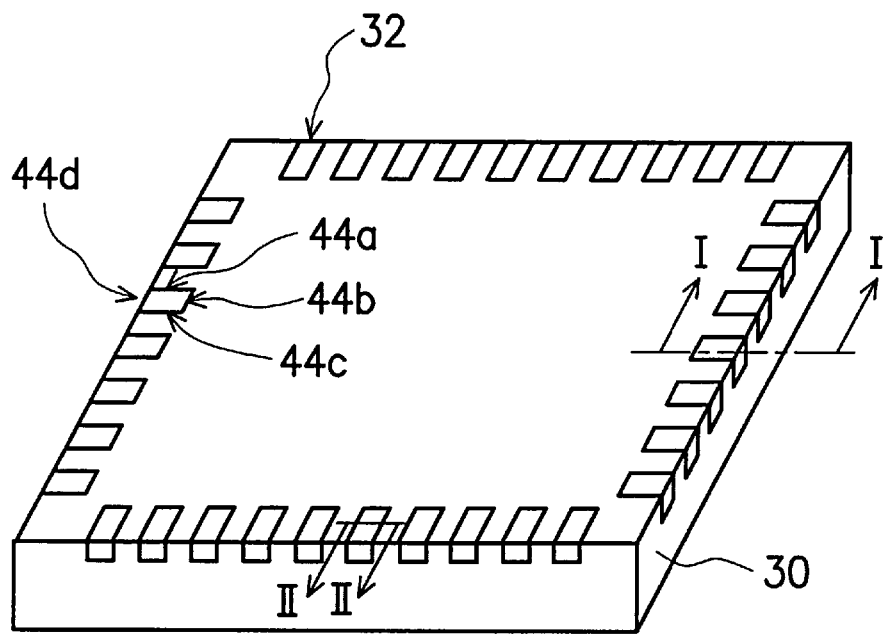
FIG. 4A is a schematic perspective view showing the arrangement of the package-free bonding pads according to a first preferred embodiment of this invention.
Figure 4B:
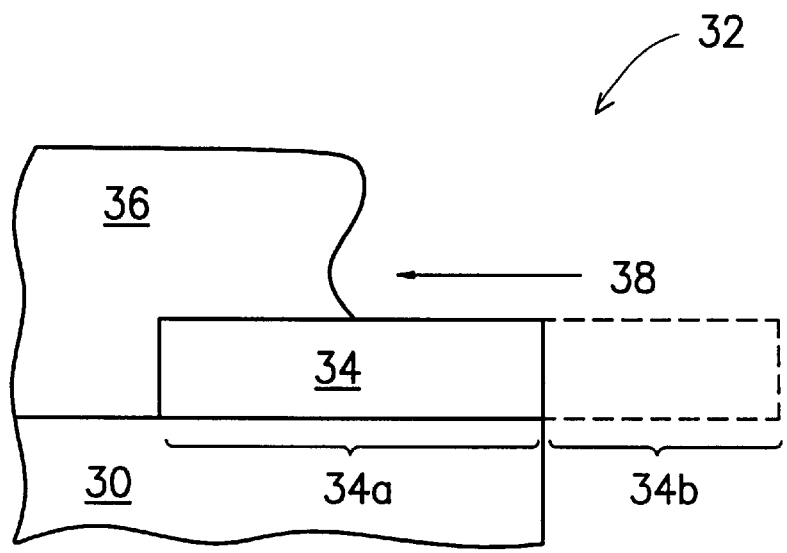
FIG. 4B shows a portion of the schematic cross-sectional view along line I—I of the bonding pad as shown in FIG. 4A.
Figure 4C:
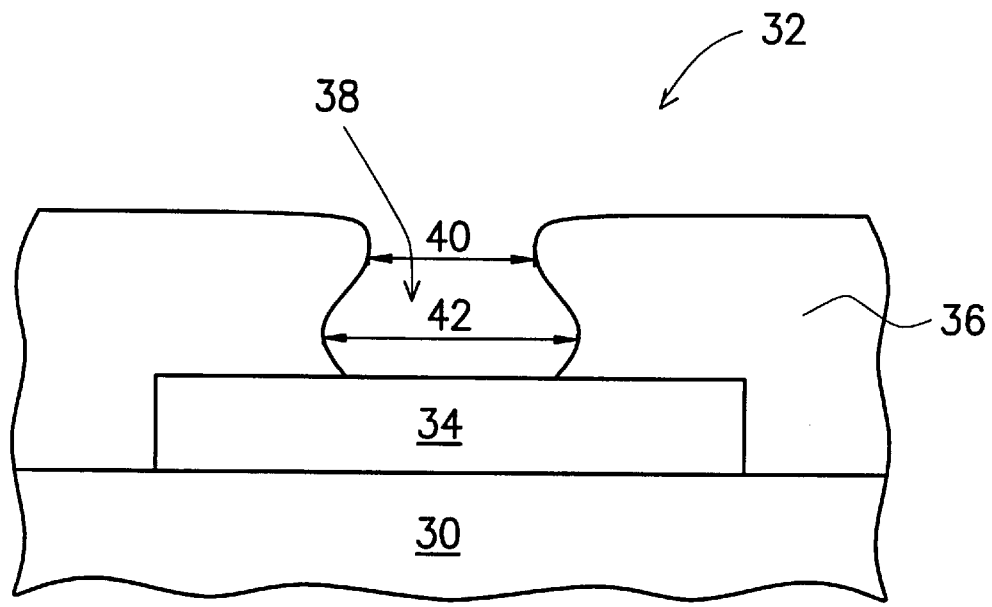
FIG. 4C shows a portion of the schematic cross-sectional view along line II—II of the bonding pad as shown in FIG. 4A.

FIG. 4A is a schematic perspective view showing the arrangement of the package-free bonding pads according to a first preferred embodiment of this invention. The bonding pad structures 32 of this invention are formed on the upper surface of a silicon chip 30 and arranged to remain at the periphery of the silicon chip. Alternatively, the bonding pad structures 32 can be arranged to spread over the entire silicon chip surface, thereby forming an area array. FIG. 4B shows a portion of the schematic cross-sectional view along line I—I of the bonding pad as shown in FIG. 4A. FIG. 4C shows a portion of the schematic cross-sectional view along line II—II of the bonding pad as shown in FIG. 4A. The bonding pad structure 32 of this invention is created out of a metal pad 34 on the silicon chip surface and a surrounding layer of passivation material 36. The metal pad 34 is formed over the silicon chip 30 only after some electronic devices such as MOS transistors, capacitors, resistors and multilevel interconnects are formed. The metal pad 34 can be formed by sputtering a layer of metallic material such as aluminum over the silicon chip 30, and then patterning the metal pad 34 using photolithographic and etching operations. To prevent the oxidation of the metal pad 34, a layer of anti-oxidation metallic layer, for example, titanium or titanium nitride can be coated on top.

The passivation layer 36 can be, for example, an oxide layer, a silicon nitride layer or some other organic insulation material. Obviously, the passivation layer 36 can also be a stack of different insulation layers. Beside good insulation properties, the passivation layer 36 must have good elastic properties as well. The passivation layer 36 is preferably formed over the metal pads 34 using a deposition process or a coating method.

Subsequently, open cavities 38 that expose a portion of the metal pad 34 surface are formed in the passivation layer 36 by performing a wet etching operation. Note also that each open cavity 38 above the metal pad 34 is shaped into a centrally bulging female socket. In other words, diameter of the open cavity 38 gets smaller on approaching the upper surface of the passivation layer 36 (labeled 40 in FIG. 4C) and gets bigger on approaching the metal pad 34 surface (labeled 42 in FIG. 4C). The advantage of forming the open cavity 38 into this shape is that a carrier or a printed circuit board having male connection plugs shaped into a mushroom-like protrusion (not drawn in the figure) can snap into the female socket cavity 38. As long as the material for forming the passivation layer can provide sufficient elasticity, a tight electrical contact can be secured between the metallic male plug on the carrier or printed circuit board and the metal pad 34. Moreover, female-male interlock within the open cavities 38 is able to fasten the carrier or the printed circuit board onto the silicon chip 30 without the need to perform a special soldering operation using special processing equipment.

In addition, the metal pad 34 in this embodiment is preferably rectangular. In other words, the metal pad 34 should have four sides: sides 44a, 44b, 44c and 44d. When the bonding pads 32 are formed around the peripheral region of the silicon chip 30, it is preferable to have the passivation layer 36 on three sides of the metal pad 34. That is, only three sides of the metal pad 34 including sides 44a, 44b and 44c are enclosed with the side 44d facing the edge of the silicon chip 30 exposed. With this structural arrangement, joining the silicon chip 30 to a carrier or a printed circuit board is much easier because sideward engagement is now possible.

Figure 4D:
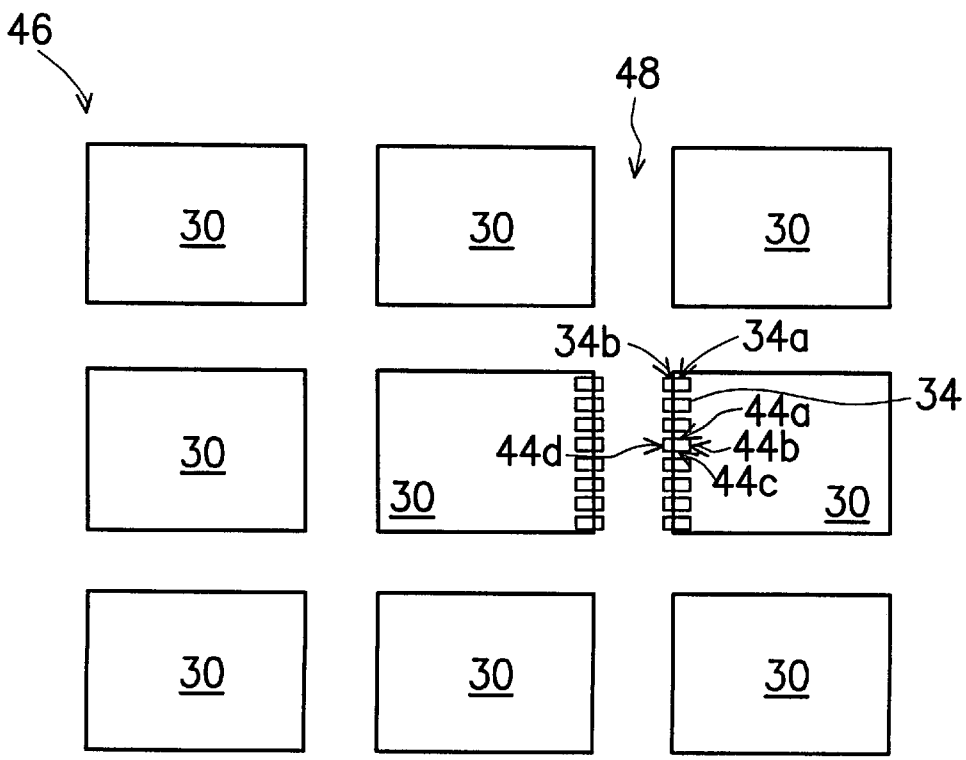
FIG. 4D is a schematic top view showing nine silicon chips having the bonding pad structure according to the first preferred embodiment of this invention lying next to each other inside a silicon wafer.

FIG. 4D is a top view showing nine silicon chips having the bonding pad structure according to the first preferred embodiment of this invention lying next to each other inside a silicon wafer. In FIG. 4D, metal pads are shown to be on the edges of each silicon chip. In general, each silicon wafer 46 contains a number of silicon chips 30, and a so-called scribe line separates one silicon chip 30 on the wafer 46 from its neighbor.

To achieve a structure having three of its sides enclosed by the passivation layer 36 and the remaining side facing the edge of an exposed silicon chip, the metal pad 34 can be formed in such a way that a portion of it lies inside the silicon chip 30 while the remaining portion of it lies on the scribe line 48 (for example, 34b in FIG. 4D). Thereafter, the passivation layer 36 is patterned to form the open cavities 38 above the metal pads 34. Finally, when the silicon chips 30 are sawn out along the scribe lines 48, the metal pads 34 are surrounded by the passivation layer 36 on three sides only, namely, 44a, 44b and 44c.

Figure 5:
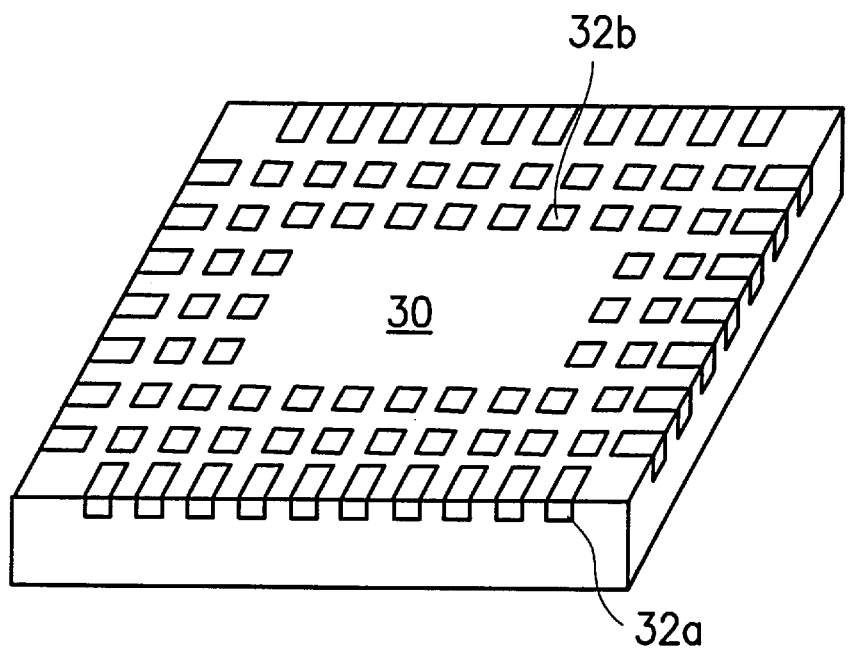
FIG. 5 is a schematic perspective view showing the arrangement of package-free bonding pads according to a second preferred embodiment of this invention.

FIG. 5 is a perspective view showing the arrangement of package-free bonding pads according to a second preferred embodiment of this invention. The bonding pads of this invention need not be limited to the peripheral region of a silicon chip. The bonding pads can also be arranged to form an area array. As shown in FIG. 5, for the bonding pads 32a that are arranged to lie on the peripheral region of the silicon chip 30, each metal pad 32a is enclosed by the passivation layer (not shown in the figure) on only three sides. On the other hand, for the bonding pads 32b that lie in the interior region of the silicon chip 30, their metal pads are enclosed on all four sides by the passivation layer.

Figure 6:
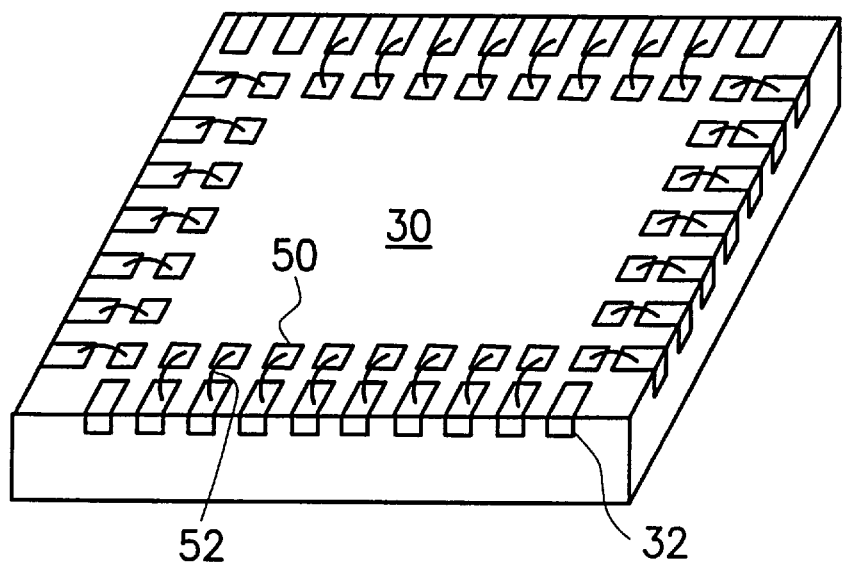
FIG. 6 is a schematic perspective view showing the arrangement of package-free bonding pads next to conventional bonding pads according to a third preferred embodiment of this invention.

FIG. 6 is a perspective view showing the arrangement of package-free bonding pads next to conventional bonding pads according to a third preferred embodiment of this invention. The bonding pads 32 of this invention can also be used side-by-side with conventional bonding pads 50. The conventional bonding pads 50 are electrically connected to the bonding pads 32 using conductive wires 52. The conductive wires can be, for example, gold, aluminum or copper wires. After the bonding pads 32 are properly connected to the conventional bonding pads, connection from the conventional bonding pads to the printed circuit board or the carrier can again be made through the male plugs. Furthermore, the connection between conventional bonding pads 50 and the bonding pad 32 can also be made via multilevel metallic interconnects (not shown in the figure) inside the silicon chip 30.

Figure 7:
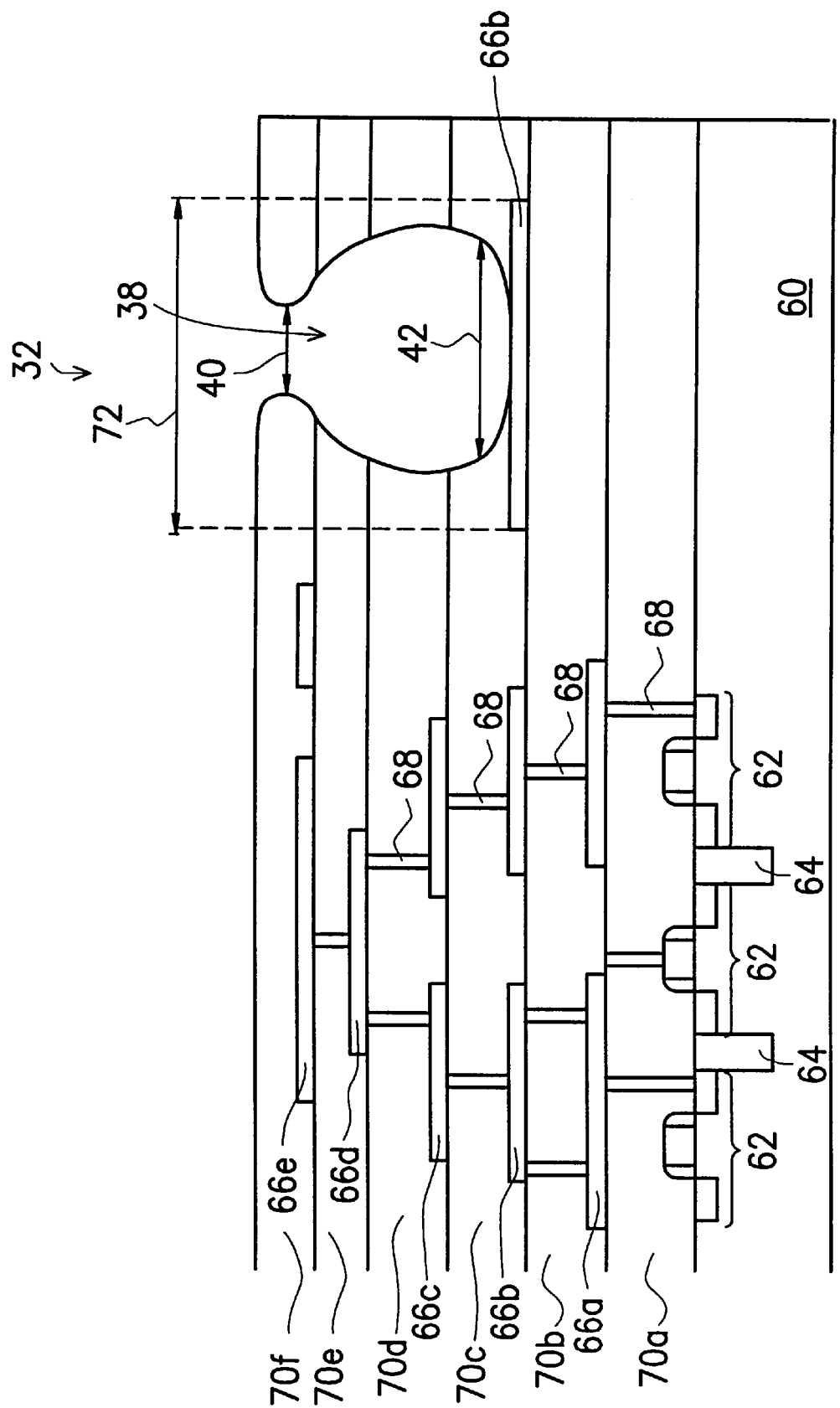
FIG. 7 is a schematic cross-sectional view showing a bonding pad structure according to a fourth preferred embodiment of this invention.

FIG. 7 is a cross-sectional view showing a bonding pad structure according to a fourth preferred embodiment of this invention. In the previous three embodiments, all the metal pads are supposed to use the uppermost metallic layer and the passivation layer is supposed to be the uppermost insulation layer. However, this arrangement does not necessarily have to be strictly followed. In fact, the bonding pad can also be made to contact one of the conductive layers lower down inside the silicon chip so that the overlying stack of insulation layers can act as one passivation layer.

As shown in FIG. 7, a silicon chip generally has a substrate 60 that comprises MOS transistors 62 and isolating structures 64. Furthermore, there are a few conductive layers 66a, 66b, 66c, 66d, 66e above the substrate 60 and several metallic plugs or contacts 68 for interconnecting various layers forming a rather complicated electrical network. Between various conductive layers 66a, 66b, 66c, 66d, 66e and above the conductive layer 66e, there are insulation layers including 70a, 70b, 70c, 70d, 70e, 70f that serve to insulate or protect the circuits.

The bonding pad structure 32 of this invention can use any one of the multilevel conductive layers 66a, 66b, 66c, 66d, 66e for forming the metal pads. For example, the conductive layer 66b is chosen to form the metal pads in FIG. 7. However, once a particular conductive layer such as 66b is chosen, the bonding pad region 72 directly above the conductive layers 66b can no longer be covered by any conductive layers such as 66c, 66d, 66e, 66f. The bonding pad structure of this invention is formed by patterning various conductive layers 66a, 66b, 66c, 66d, 66e in turn using photolithographic operations.

Consequently, only a stack of insulation layers 70c, 70d, 70e, 70f remains above the bonding pad region 72. The insulation layers 70c, 70d, 70e, 70f together serve as a passivation layer. Afterwards, open cavities 38 are formed passing through the various insulation layers 70c, 70d, 70e and 70f using a wet etching method to expose a portion of the conductive layer 66b in the bonding pad region 72. Similarly, the open cavity 38 also has a bulging interior that acts as a female socket. That is, diameter 40 on approaching the upper surface of the insulation layer 70f is smaller than the diameter 42 in the neighborhood of the conductive layer 66b surface.

Similar to previous embodiments, the bonding pad structure of the fourth embodiment can also be arranged to lie on the peripheral region of a silicon chip with the protective insulation layers surrounding the metal pad on three sides. In addition, the fourth embodiment of this invention can also be used together with conventional bonding pads with arrangements that are similar to the third embodiment illustrated in FIG. 6.

In summary, the package-free bonding pad structure comprises of a centrally bulging female socket formed above the metal pad of a silicon chip for engaging with a mushroom-shaped male plug on a carrier or a printed circuit board. Therefore, once the female sockets are formed in the silicon chip, the male plugs on the carrier or the printed circuit board can easily snap into the socket by the application of a small pressure. Utilizing the special elastic properties of the passivation material around the socket, a good electrical contact can be made between the metal pad on the silicon chip and the male plug on the carrier or printed circuit board. Since sophisticated soldering operations for coupling the silicon chip to a carrier or a printed circuit board are unnecessary, special processing stations do not need to be purchased and production cost is lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package-free bonding pad structure on a silicon chip, comprising:
   a plurality of metal pads on an upper surface of the silicon chip; and
   a passivation layer over the upper surface of the silicon chip with open cavities that expose a portion of the metal pads, wherein a diameter of each open cavity gets smaller on approaching the upper surface of the passivation layer while the diameter gets bigger on approaching the metal pad.

2. The structure of claim 1, wherein the metal pads together form an area array pattern above the silicon chip.

3. The structure of claim 1, wherein the metal pads are positioned along the peripheral region of the silicon chip.

4. The structure of claim 3, wherein the silicon chip further includes a plurality of contact pads on the upper surface of the silicon chip next to the metal pads but further towards the central region of the chip, furthermore each of these contact pads is electrically coupled to its nearest metal pad.

5. The structure of claim 4, wherein the contact pads are coupled to their nearest metal pads using a plurality of metallic interconnects.

6. The structure of claim 4, wherein the contact pads are coupled to their nearest metal pads using a plurality of metallic wires.

7. The structure of claim 1, wherein the metal pads are rectangular.

8. The structure of claim 7, wherein the passivation layer surrounds all four sides of the metal pad.

9. The structure of claim 7, wherein the metal pads are positioned along a periphery of the silicon chip, and furthermore each metal pad is surrounded by the passivation layer on three sides, with a fourth side facing an edge of the exposed chip.

10. The structure of claim 1, wherein the passivation layer can be a stack of insulation layers.

11. A package-free boding pad structure, comprising:
    a substrate;

a plurality of conductive layers above the substrate; and a plurality of insulation layers above the substrate, wherein adjacent conductive layers are separated from each other by an insulating layer, a plurality of bonding pad areas are formed on one of the conductive layers, each of the conductive layers and each of the insulation layers has a corresponding pattern so that at least no conductive layers are formed over the bonding pad areas, a plurality of open cavities that expose a portion of the bonding pad are formed inside the insulation layers above the bonding pad areas, and furthermore a diameter of the open cavity gets smaller on approaching the upper surface of uppermost insulation layer while the diameter gets bigger on approaching the conductive layer in the bonding pad area.

12. The structure of claim 11, wherein the bonding pad areas together form an area array pattern above the substrate.

13. The structure of claim 11, wherein the bonding pad areas are formed along the peripheral region of the substrate.

14. The structure of claim 13, wherein the structure further includes a plurality of contact pads above the substrate, and furthermore each of the contact pads is electrically coupled to the conductive layer inside a corresponding bonding pad area.

15. The structure of claim 14, wherein the contact pads are electrically coupled to the conductive layer inside their respective bonding pad area using a plurality of metallic interconnects.

16. The structure of claim 14, wherein the contact pads are electrically coupled to the conductive layer inside their respective bonding pad areas using a plurality of metallic wires.

17. The structure of claim 11, wherein the bonding pad areas are rectangular.

18. The structure of claim 17, wherein the stack of insulation layers above each bonding pad area surround the bonding pad area on all four sides.

19. The structure of claim 17, wherein the bonding pad areas are positioned along a periphery of the substrate, and furthermore each bonding pad area is surrounded by the stack of insulation layers on three sides, with a fourth side facing an edge of the exposed chip.

* * * * *